United States Patent
Ghosh et al.

(10) Patent No.: US 12,527,060 B2
(45) Date of Patent: Jan. 13, 2026

(54) STRUCTURE WITH UPPER FEATURES OF ADJACENT METAL STRUCTURES WITH SIDEWALL SPACERS PROVIDING VOID-FREE DIELECTRIC FILLING

(71) Applicant: GlobalFoundries Singapore Pte. Ltd., Singapore (SG)

(72) Inventors: Abhijit Ghosh, Singapore (SG); Suk Hee Jang, Singapore (SG); Deepthi Kandasamy, Singapore (SG); Young Seon You, Singapore (SG); Yoke Leng Lim, Singapore (SG)

(73) Assignee: GLOBALFOUNDRIES SINGAPORE PTE LTD, Singapore (SG)

( * ) Notice: Subject to any disclaimer, the term of this patent is extended or adjusted under 35 U.S.C. 154(b) by 392 days.

(21) Appl. No.: 18/177,251

(22) Filed: Mar. 2, 2023

(65) Prior Publication Data
US 2024/0297238 A1   Sep. 5, 2024

(51) Int. Cl.
*H10D 64/01* (2025.01)
*H01L 23/528* (2006.01)
*H10D 84/01* (2025.01)
*H10D 84/03* (2025.01)

(52) U.S. Cl.
CPC ....... *H10D 64/021* (2025.01); *H01L 23/5283* (2013.01); *H10D 84/0147* (2025.01); *H10D 84/038* (2025.01)

(58) Field of Classification Search
CPC ............... H10D 64/021; H10D 64/675; H10D 84/8316; H10D 30/0195; H10D 30/0196; H10D 30/0197; H10D 30/507; H10D 30/508; H10D 30/509; H10D 64/015; H10D 64/018; H10D 84/0147; H10D 30/0285; H10D 30/0293; H10D 84/0184
See application file for complete search history.

(56) References Cited

U.S. PATENT DOCUMENTS

| | | |
|---|---|---|
| 5,858,870 A | 1/1999 | Zheng et al. |
| 5,872,058 A | 2/1999 | Van Cleemput et al. |
| 8,133,797 B2 | 3/2012 | van Schravendijk et al. |

(Continued)

OTHER PUBLICATIONS

Wang et al., "Aluminum Gap Fill Improvement for 28 HKMG Process," 2022 China Semiconductor Technology International Conference (CSTIC), CSTIC55103.2022.9856745, 2022IEEE, 4 pages.

*Primary Examiner* — Moazzam Hossain
(74) *Attorney, Agent, or Firm* — Francois Pagette; Hoffman Warnick LLC

(57) ABSTRACT

A structure includes a first metal structure including a first upper metal feature having a first sidewall spacer thereabout, and a first lower metal feature under the first upper metal feature. The first lower metal feature includes a sidewall devoid of the first sidewall spacer. The structure also includes a second metal structure spaced from the first metal structure. The second metal structure includes a second upper metal feature having a second sidewall spacer thereabout, and a second lower metal feature under the first upper metal feature. The second lower metal feature includes a sidewall devoid of the second sidewall spacer. A dielectric is between the first metal structure and the second metal structure. The dielectric is devoid of any voids therein, and the opening it fills has a high aspect ratio. A related method is also provided.

18 Claims, 4 Drawing Sheets

(56) References Cited

U.S. PATENT DOCUMENTS

| | | |
|---|---|---|
| 11,444,030 B2 | 9/2022 | Yang et al. |
| 2002/0052119 A1 | 5/2002 | Van Cleemput |
| 2003/0013271 A1 | 1/2003 | Knorr et al. |
| 2004/0048468 A1* | 3/2004 | Liu .................. H01L 21/76865 257/E21.585 |
| 2007/0218686 A1* | 9/2007 | Wang ................ H01L 21/76838 257/E21.585 |
| 2009/0286381 A1 | 11/2009 | van Schravendijk et al. |
| 2019/0006228 A1 | 1/2019 | Huang et al. |
| 2019/0067104 A1* | 2/2019 | Huang ................... H01L 24/16 |
| 2020/0127089 A1* | 4/2020 | Hsu .................. H01L 23/53266 |
| 2021/0384416 A1 | 12/2021 | Jang et al. |
| 2022/0051989 A1* | 2/2022 | Agarwal ............... H01L 24/20 |

* cited by examiner

STRUCTURE WITH UPPER FEATURES OF ADJACENT METAL STRUCTURES WITH SIDEWALL SPACERS PROVIDING VOID-FREE DIELECTRIC FILLING

BACKGROUND

The present disclosure relates to integrated circuit (IC) structures and, more particularly, to a structure including adjacent metal structures having sidewall spacers on upper metal features thereof to aid in void-free dielectric gap filling.

IC structures include adjacent metal structures, such as aluminum wiring, that are electrically isolated by a dielectric. The metal structures may be relatively tall and separated by very short distances, creating high aspect ratio (ratio of height to width) openings therebetween. The high aspect ratio openings are challenging to fill with the dielectric. For example, current dielectric deposition approaches use a single etch process and create unacceptable seams or voids within the dielectric.

SUMMARY

All aspects, examples and features mentioned below can be combined in any technically possible way.

An aspect of the disclosure provides a structure, comprising: a first metal structure including a first upper metal feature having a first sidewall spacer, and a first lower metal feature under the first upper metal feature, the first lower metal feature including a sidewall devoid of the first sidewall spacer; a second metal structure spaced from the first metal structure, the second metal structure including a second upper metal feature having a second sidewall spacer, and a second lower metal feature under the second upper metal feature, the second lower metal feature including a sidewall devoid of the second sidewall spacer; and a dielectric between the first metal structure and the second metal structure.

An aspect of the disclosure provides a structure, comprising: a first aluminum structure including a first upper aluminum feature having a first sidewall spacer, and a first lower aluminum feature under the first upper aluminum feature, the first lower aluminum feature including a sidewall devoid of the first sidewall spacer; a second aluminum structure spaced from the first aluminum structure, the second aluminum structure including a second upper aluminum feature having a second sidewall spacer, and a second lower aluminum feature under the second upper aluminum feature, the second lower aluminum feature including a sidewall devoid of the second sidewall spacer; and a void-less dielectric between the first aluminum structure and the second aluminum structure, wherein the void-less dielectric has an aspect ratio between 1.0 and 2.0.

An aspect of the disclosure provides a method, comprising: forming a first upper metal feature spaced from a second upper metal feature, each of the first and second upper metal features having a sidewall spacer; forming a first lower metal feature under the first upper metal feature and a second lower metal feature under the second upper metal feature, the first and second lower metal features including sidewalls devoid of any sidewall spacer; and filling an opening between the first upper metal feature over the first lower metal feature and the second upper metal feature over the second lower metal feature with a dielectric, wherein the dielectric is devoid of voids therein.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
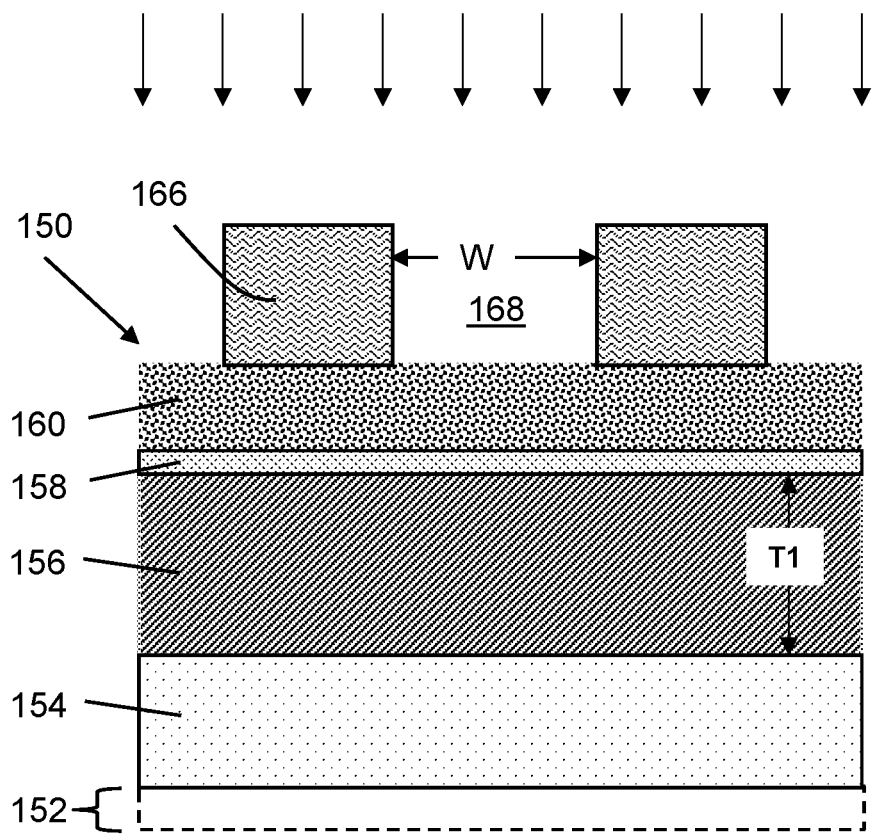
FIG. 1 shows a cross-sectional view of a preliminary structure for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof and in which are shown, by way of illustration, illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This notation may be extended, as readily apparent to one of ordinary skill in the art, for as many items listed.

Embodiments of the disclosure include a structure that includes a first metal structure including a first upper metal feature having a first sidewall spacer, and a first lower metal feature under the first upper metal feature. The first lower metal feature includes a sidewall devoid of a sidewall spacer including the first sidewall spacer. The structure also includes a second metal structure spaced from the first metal structure. The second metal structure includes a second upper metal feature having a second sidewall spacer, and a second lower metal feature under the first upper metal feature. The second lower metal feature includes a sidewall devoid of a sidewall spacer, including the second sidewall spacer. A dielectric is between the first metal structure and the second metal structure and is devoid of any seams or voids therein despite the opening having a high aspect ratio. More particularly, the partial vertical and partial slanted sidewalls of the structures, based on a two-step etch process (masked and blanket) provides void-free gap fulling using a dielectric. The structure is advantageous for the development of complementary metal-oxide semiconductor (CMOS) hybrid bond metal planarization. A related method is also provided.

Figure 2:
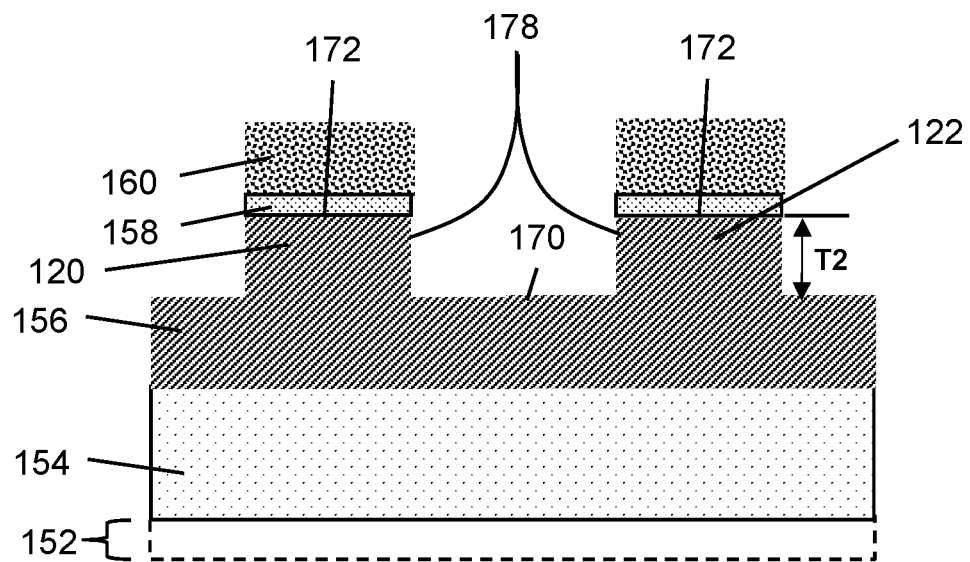
FIG. 2 shows a cross-sectional view of forming upper metal features of adjacent metal structures, according to embodiments of the disclosure.
Figure 3:
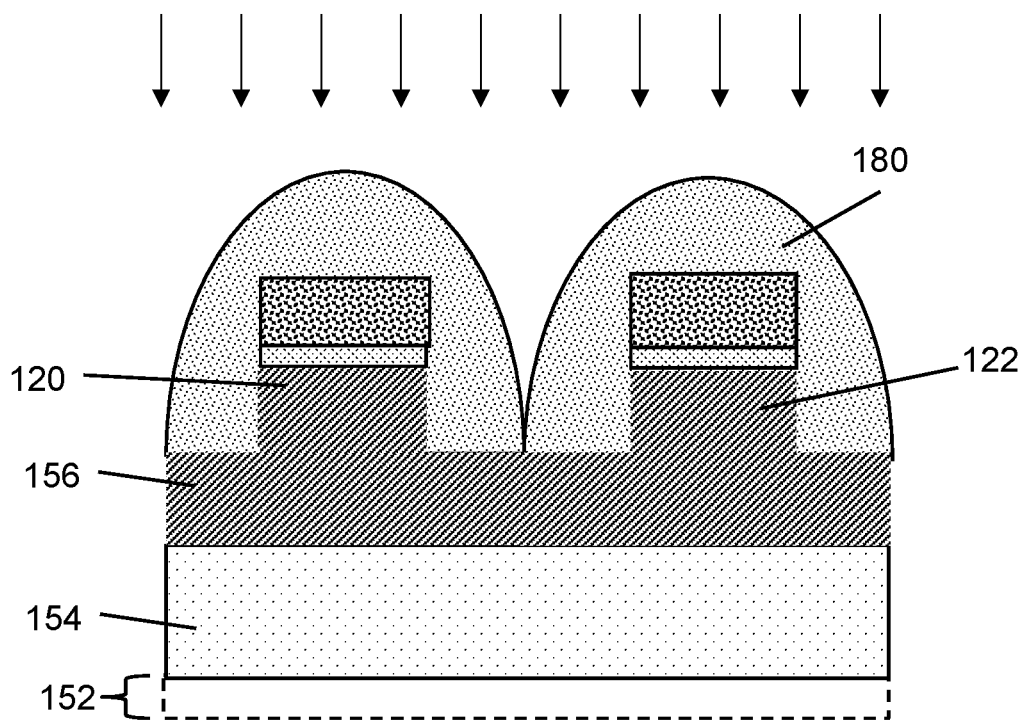
FIG. 3 shows a cross-sectional view of depositing a sidewall spacer material layer over the upper metal features and a remaining part of a metal layer, according to embodiments of the disclosure.
Figure 4:
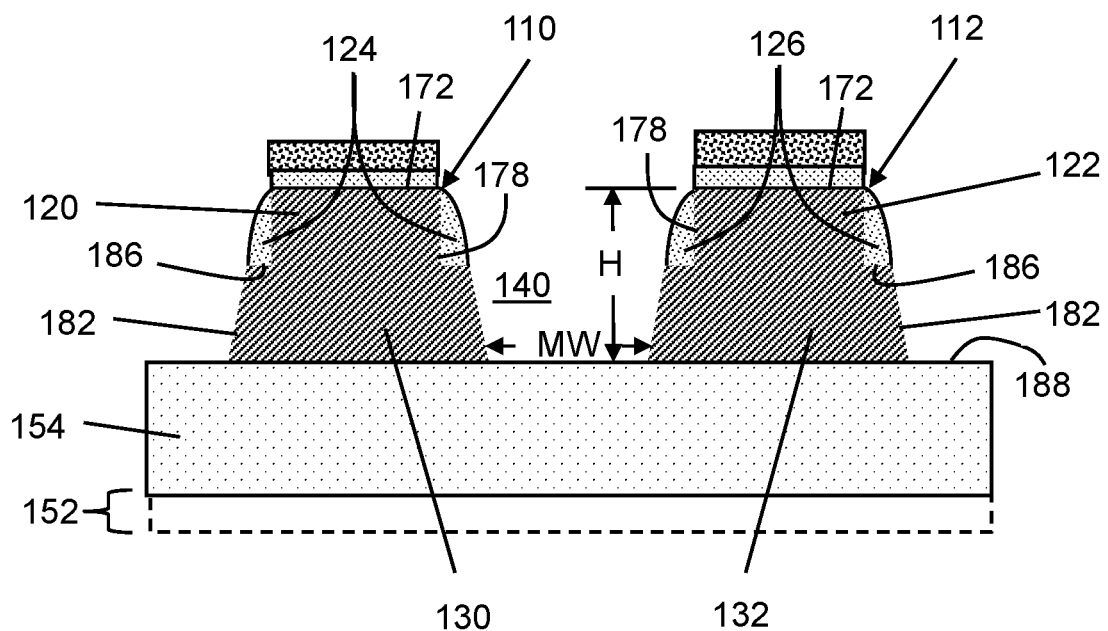
FIG. 4 shows a cross-sectional view after a blanket etch forming first and second lower metal features under the upper metal features and forming sidewall spacers about the upper metal features, according to embodiments of the disclosure.
Figure 5:
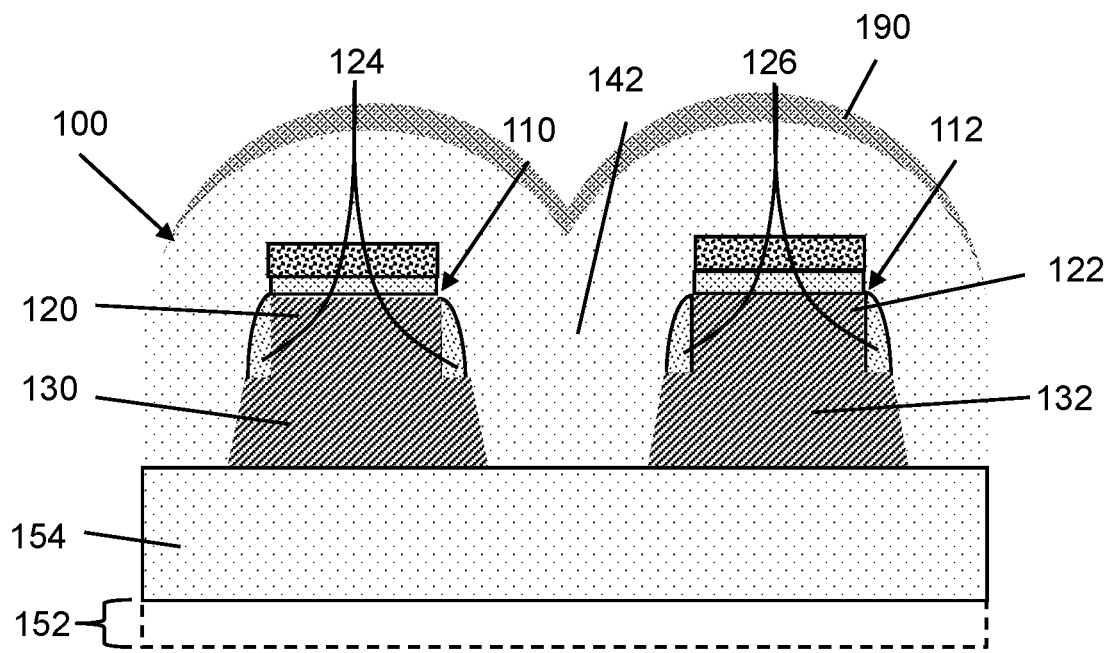
FIG. 5 shows a cross-sectional view of filling a gap between the metal structures with a dielectric, according to embodiments of the disclosure.
Figure 6:
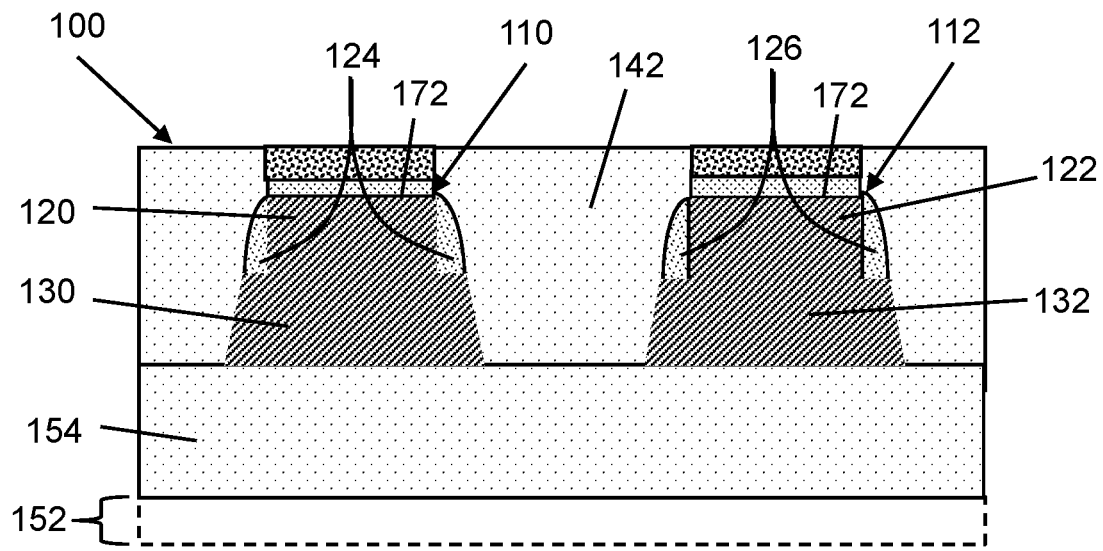
FIG. 6 shows a cross-sectional view of the structure after planarizing, according to embodiments of the disclosure.

FIGS. 1-6 show cross-sectional views of a method of forming a structure 100 (FIG. 6) including a first metal structure 110 (FIG. 6) and an adjacent second metal structure 112 (FIG. 6) according to embodiments of the disclosure. As an introduction, FIGS. 1-2 show forming a first upper metal feature 120 spaced from a second upper metal feature 122; FIGS. 3-4 show forming a sidewall spacer 124, 126 about each of first and second upper metal features 120, 122 and forming a first lower metal feature 130 under first upper metal feature 120 and a second lower metal feature 132 under second upper metal feature 130; and FIGS. 5 and 6 show filling an opening 140 (FIG. 4) between first metal structure 110 and adjacent second metal structure 112 with a dielectric 142. As will be described, a two etch process is used to form metal structures 110, 112 having a high aspect ratio opening 140 therebetween. Despite the high aspect ratio opening 140, metal structures 110, 112 are arranged such that the dielectric 142 filling opening 140 does not have voids therein.

Turning to FIG. 1, the drawing shows a cross-sectional view of a preliminary structure 150 for a method according to embodiments of the disclosure. Preliminary structure 150 includes any number of back-end-of-line (BEOL) interconnect layers 152 (not individually shown) of an integrated circuit (IC) structure. As understood in the art, BEOL interconnect layers 152 electrically connect different devices, e.g., transistors, resistors, capacitors, etc., that may be in a device layer or a lower BEOL interconnect layer 152 of the IC structure. BEOL interconnect layers 152 may include dielectric layers including one or more of metal wires that run laterally through the layer or metal contacts or vias that run vertically through the layer. It is emphasized that BEOL interconnect layers 152 are not shown to scale. BEOL interconnect layers 152 and the device layer (not shown) of the IC structure may be formed using any now known or later developed semiconductor fabrication techniques. Such techniques are well known in the art and thus are not further described.

Preliminary structure 150 also includes a back-end-of-line (BEOL) dielectric layer 154 of an uppermost layer of BEOL interconnect layers 152. Dielectric layer 154 may be at variety of different levels of the IC structure depending on application of metal structures 110, 112 (FIG. 6). In one non-limiting example, where metal structures 110, 112 (FIG. 6) will be used for hybrid bonding (see FIG. 7), BEOL dielectric layer 154 (hereafter "dielectric layer 154") may be a sixth metal layer (M6). Dielectric layer 154 is shown without any interconnects therein, for clarity, but could include any variety of interconnects (wires or vias) to metal structures 110, 112 (FIG. 6) and lower BEOL interconnect layer(s) 152. Dielectric layer 154, as well as the dielectrics of BEOL interconnect layers 152, may include any now known or later developed interlayer dielectric. Suitable dielectric materials include but are not limited to: silicon dioxide; carbon-doped silicon dioxide materials; fluorinated silicate glass (FSG); organic polymeric thermoset materials; silicon oxycarbide; SiCOH dielectrics; or fluorine doped silicon oxide. Dielectric layer 154 may be formed over lower BEOL interconnect layers 152 using any appropriate deposition technique for the dielectric material used, e.g., chemical vapor deposition (CVD) for silicon dioxide.

Preliminary structure 150 also includes a metal layer 156 over dielectric layer 154. As will be described, metal layer 156 is used to form metal structures 110, 112 (FIG. 6) with a relatively small pitch and, thus, having a high aspect ratio opening 140 (FIG. 4) therebetween. Metal layer 156 may include any conductive metal typically used in BEOL interconnect layers. For example, the teachings of the disclosure are advantageous with aluminum (Al) metal structures 110, 112. As will be described, metal layer 156 may be used to form metal structures 110, 112 (FIG. 6). While the disclosure will reference aluminum metal structures 110, 112 (FIG. 6) made from the metal of metal layer 156, other conductive metals, such as but not limited to copper and tungsten, can also be used. In certain embodiments, metal layer 156 may have a thickness T1 in a range of, for example, 1300 to 2000 nanometers (nm). Metal layer 156 may be formed over dielectric layer 154 using any appropriate deposition technique for the metal used, e.g., CVD for aluminum.

A capping layer 158 may be formed over metal layer 156. Capping layer 158 may include any now known or later developed capping material for the metal of metal layer 156, e.g., tantalum nitride for aluminum. A hard mask layer 160 may be formed over metal layer 156. Hard mask layer 160 may include any now known or later developed hard masking material layer(s), such as silicon nitride. A photoresist mask 166 may be formed over mask layer 160. Photoresist mask 166 may include any appropriate masking material and may be patterned in a known fashion. Photoresist mask 166 includes an opening 168 therein having width W.

FIG. 2 shows a cross-sectional view of the structure after etching preliminary structure 150 (FIG. 1) (see arrows in FIG. 1) using photoresist mask 166. The etching process may include any appropriate etching chemistry for the material of capping layer 158 and metal layer 156, e.g., a reactive ion etch (RIE) for aluminum. FIG. 2 shows forming upper metal features 120, 122 of metal structures 110, 112 (FIG. 6) according to embodiments of the disclosure. Forming first upper metal feature 120 spaced from second upper metal feature 122 is performed by removing part of metal layer 156 over dielectric layer 154. More particularly, the etching can be controlled, e.g., strength and duration, to etch away capping layer 158 and etch part way into metal layer 156 to form upper metal features 120, 122. First upper metal feature 120 (left side) is spaced from second upper metal feature 122 (right side) based on width W of opening 168 (FIG. 5) in photoresist mask 166 (FIG. 5) and the RIE process. Upper metal features 120, 122 may have a thickness T2 defined from an upper surface 170 of the remaining part of metal layer 156 to an upper surface 172 of each upper metal feature 120, 122. The RIE can be controlled, e.g., strength and duration, to etch the desired depth into metal layer 156. In one non-limiting example, the RIE may remove 35-50% of the thickness T1 (FIG. 1) of metal layer 156. After the etching, first upper metal feature 120 and second upper metal feature 122 have vertical sidewalls 178 (only inner sidewalls labeled for clarity). Part of mask layer 160 remains over capping layer 158 after the RIE. Any remaining photoresist mask 166 is also removed during the etching.

FIG. 3 shows a cross-sectional view of depositing a sidewall spacer material layer 180 (hereafter "spacer layer 180") over first and second upper metal features 120, 122 and a remaining portion of metal layer 156, according to embodiments of the disclosure. Spacer layer 180 may include any now known or later developed dielectric material capable of use as a sidewall spacer including but not limited to a nitride such as silicon nitride, silicon carbon nitride, silicon boron carbon nitride, or any other suitable dielectric sidewall spacer material. Spacer layer 180 may be deposited using any appropriate deposition technique, e.g., CVD. Spacer layer 180 contacts sidewalls 178 (FIG. 2) of upper metal features 120, 122.

FIG. 4 shows a cross-sectional view after a blanket etch (i.e., with no new mask—see arrows in FIG. 3) to complete metal structures 110, 112. More particularly, FIG. 4 shows forming first and second lower metal features 130, 132 under upper metal features 120, 122, respectively, completing metal structures 110, 112. The blanket etch also forms sidewall spacers 124, 126 about upper metal features 120, 122, respectively, and forms opening 140 between the metal structures 110, 112. The blanket etch may include any appropriate etching chemistry for spacer layer 180 and metal layer 156, e.g., a RIE. The blanket etch removes much of spacer layer 180, forming respective sidewall spacers 124, 126 on first upper metal feature 120 and second upper metal feature 122. Hence, the etch of FIG. 3 finalizes forming first upper metal feature 120 spaced from second upper metal feature 122 with each of first and second upper metal features 120, 122 having a sidewall spacer 124, 126. Sidewall spacers 124, 126 also prevent further etching first upper metal feature 120 and second upper metal feature 122. Sidewall spacers 124, 126 being nitride-based dielectric also help prevent pinch-through by the hybrid bond metal contacts (not shown) which are formed as part of the process following planarization of structures 110, 112. Sidewall spacers 124, 126 have tapered sidewalls (not labeled for clarity), i.e., they are not vertical but are angled inwardly toward upper metal features 120, 122.

As also shown in FIG. 4, the blanket etch (FIG. 3) also removes the remaining part of metal layer 156 to dielectric layer 154. This process forms first lower metal feature 130 under first upper metal feature 120 and second lower metal feature 132 under second upper metal feature 122 by etching away the remaining part of metal layer 156 to dielectric layer 154. The blanket etching of FIG. 3 also removes spacer layer 180 from over the remaining part of metal layer 156 such that first and second lower metal features 130, 132 are devoid of any sidewall spacer, i.e., on a sidewall thereof. That is, sidewall spacers 124, 126 are not on sidewalls of lower metal features 130, 132, and, as will be described, sidewalls of lower metal features 130, 132 are in direct contact with dielectric 142. Sidewall spacers 124, 126 sit on a ledge 186 of lower metal features 130, 132 extending laterally from sidewalls 178 of upper metal features 120, 122, i.e., ledge 186 defines a line between upper and lower metal features. Consequently, first and second lower metal features 130, 132 have slanted sidewalls 182, i.e., angled inwardly toward a center of metal structures 110, 112, resulting in opening 140 being wider near a top of first and second lower metal features 130, 132 than at a bottom thereof. In addition, as shown in FIG. 4, an uppermost spacing between respective sidewall spacers 124, 126 is greater than an uppermost spacing between first and second lower metal features 130, 132, making opening 140 wider near a top thereof.

The blanket etch of FIG. 3 also forms opening 140 between metal structures 110, 112. Opening 140 has a high aspect ratio, i.e., ratio of height to width. For example, opening 140 may have an aspect ratio of between 1.0 and 2.0. The aspect ratio of opening 140 (or dielectric 142 to be formed therein) is defined based on a minimum width MW of opening 140 (shown for illustrative purposes as a minimum spacing between lower metal features 130, 132 at a bottom of lower metal features 130, 132), and a height H of opening 140. Height H of opening 140 is defined as the distance between upper surfaces 172 of upper metal features 120 or 122 and an upper surface 188 of dielectric layer 154. Hence, height H is a collective height of first upper and lower metal features 130, 120 or a collective height H of the second upper and lower metal features 132, 122. In one example, collective height H of first upper and lower metal features 130, 120 and a collective height H of the second upper and lower metal features 132, 122 are both greater than 1000 nm, and a minimum spacing (minimum width MW) between first lower metal feature 130 and second lower metal feature 132 is in a range of 500 nm to 1000 nm. These dimensions result in an aspect ratio of between 1.0 and 2.0. Despite opening 140 having a high aspect ratio, as noted, an uppermost spacing between respective sidewall spacers 124, 126 (at top of metal structures 110, 112) is greater than an uppermost spacing between first and second lower metal features 130, 132, making opening 140 wider near a top thereof.

FIG. 5 shows filling opening 140 between first metal structure 110 (i.e., first upper metal feature 120 over first lower metal feature 130) and second metal structure 112

(i.e., second upper metal feature 122 over second lower metal feature 132) with dielectric 142. Dielectric 142 may include any ILD material listed herein capable of filling opening 140 without forming voids therein. In one embodiment, dielectric 142 includes but is not limited to an oxide such as silicon dioxide. In another embodiment, dielectric 142 includes but is not limited to an oxide such as a tetraethyl orthosilicate $Si(OC_2H_5)_4$ (TEOS) based silicon dioxide ($SiO_2$). The oxide is less expensive to use compared to high density plasma (HDP) oxide currently used on high aspect ratio openings. As shown, sidewalls of lower metal features 130, 132 are in direct contact with dielectric 142. Despite opening 140 (FIG. 4) having a high aspect ratio, dielectric 142 is devoid of voids therein. The different width at the top and bottom of opening 140 contributes to the void-free filling by dielectric 142. As used herein, "voids" may include any gas filled opening (e.g., an air gap) regardless of shape (e.g., tear dropped opening, circular opening, seam opening, etc.). Any variety of capping layer 190 may also be formed over dielectric 142, e.g., tantalum nitride.

FIG. 6 shows a cross-sectional view of the structure after planarizing, according to embodiments of the disclosure. The planarizing may remove any excess dielectric 142 (and 190). Although not shown, the planarizing may expose upper surface 172 of metal structures 110, 112, i.e., first upper metal feature 120 and second upper metal feature 122. The planarizing may include any now known or later developed process, e.g., chemical mechanical polishing.

Figure 7:
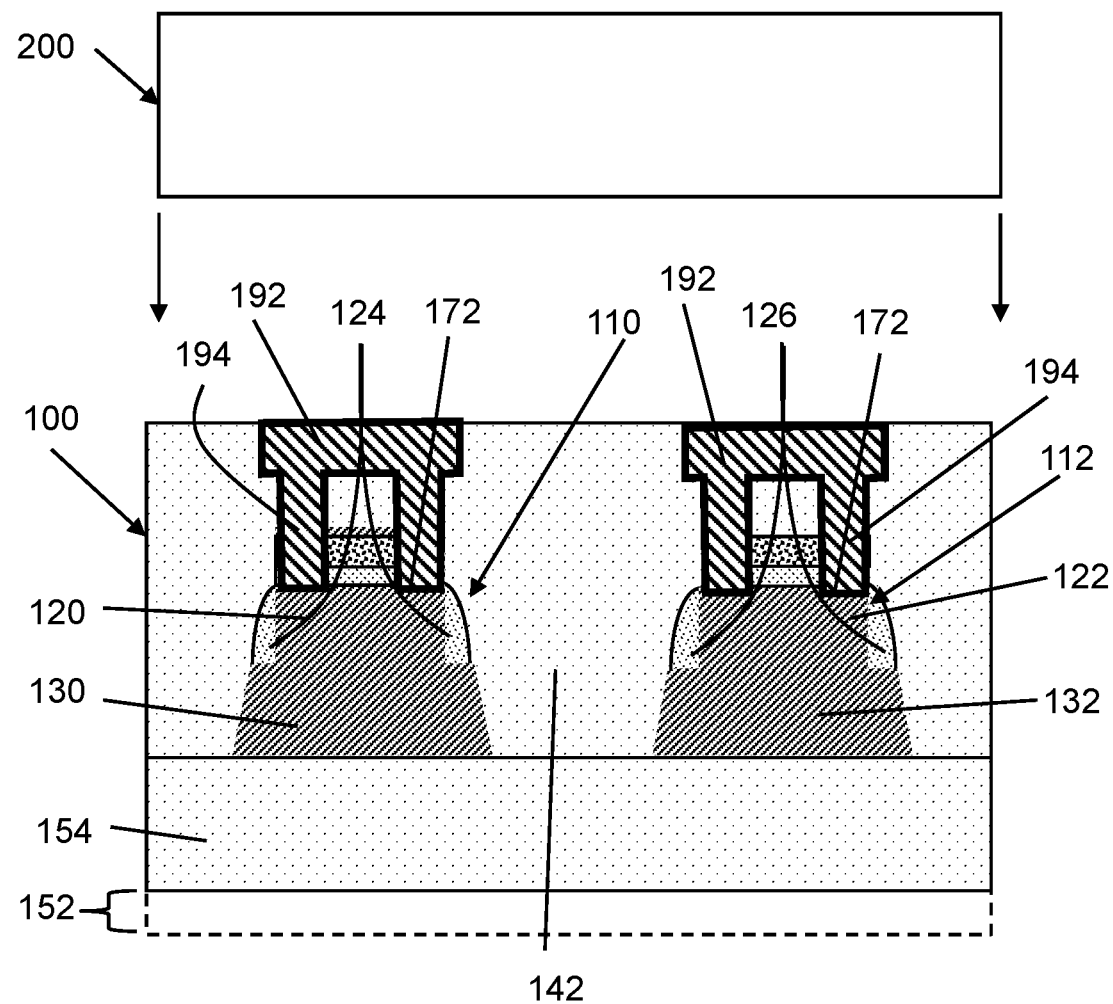
FIG. 7 shows a cross-sectional view of the structure after additional interconnect formation, according to embodiments of the disclosure.

FIG. 7 shows a cross-sectional view of the structure after additional electrical connections are formed, according to optional embodiments of the disclosure. FIG. 7 shows formation of electrical connections that may be used, for example, bond pads 192 with contacts 194 for hybrid bonding another IC structure 200 to structure 100 of FIG. 6. In the example shown, the process may include forming bond pads 192 electrically connected to each of first upper metal feature 110 and second upper metal feature 122 using contacts 194. Electrical connections, such as bond pads 192 and contacts 194, may be provided in any now known or later developed manner, e.g., damascene or dual damascene processing using copper (Cu). In a known fashion, the other IC structure 200 may include similar bond pads (not shown), and be bonded to structure 100 (and the IC structure to which it belongs). Sidewall spacers 124, 126 also provide the added advantage of protecting metal structures 110, 112 from pinch-through by bond metals, e.g., copper, used for bonding pads 192 or contacts 194. While FIG. 7 shows an optional application of structure 100, it is emphasized that FIG. 7 is just one of many applications of the present disclosure. Metal structures 110, 112 may be used for a large variety of other applications, e.g., metal wiring.

Embodiments of the disclosure also include structure 100. As shown in FIG. 6, structure 100 includes first metal structure 110 including first upper metal feature 120 having first sidewall spacer 124 and first lower metal feature 130 under first upper metal feature 120. First lower metal feature 130 is devoid of any sidewall spacer, e.g., first sidewall spacer 124 is not on a sidewall of first lower metal feature 130. Structure 100 also includes second metal structure 112 spaced from first metal structure 110. Second metal structure 112 includes second upper metal feature 122 having second sidewall spacer 126 and second lower metal feature 132 under first upper metal feature 122. Second lower metal feature 132 is devoid of any sidewall spacer, e.g., second sidewall spacer 126 is not on a sidewall of second lower metal feature 132.

In certain embodiments, first and second upper metal features 120, 122 and first and second lower metal features 130, 132 of both first and second metal structures 110, 112, respectively, include aluminum. In this case, structure 100 includes first aluminum structure 110 including first upper aluminum feature 120 having first sidewall spacer 124 and first lower aluminum feature 130 under first upper aluminum feature 120. First lower aluminum feature 130 includes a sidewall devoid of any sidewall spacer, e.g., first sidewall spacer 124. Structure 100 also includes second aluminum structure 112 spaced from first aluminum structure 110. Second aluminum structure 112 includes second upper aluminum feature 122 having second sidewall spacer 126 and second lower aluminum feature 132 under first upper aluminum feature 122. Second lower aluminum feature 132 includes a sidewall devoid of any sidewall spacer, e.g., second sidewall spacer 126. As described herein, first and second sidewall spacers 124, 126 may include a nitride.

In certain embodiments, height H of first metal structure 110 and height H of second metal structure 112 are both greater than 1000 nm. Also, in certain embodiments, a minimum spacing (minimum width WM) between first metal structure 110 and second metal structure 112, i.e., at a bottom of lower metal features 130, 132, is in a range of 500 nm to 1000 nm. These dimensions result in an aspect ratio between 1.0 to 2.0.

Structure 100 also includes dielectric 142 between first metal structure 110 and second metal structure 112. As described herein, dielectric 142 may include an oxide, such as but not limited to a TEOS-based $SiO_2$. Despite dielectric 142, i.e., opening 140, having a high aspect ratio (based on opening 140 dimensions), dielectric 142 is void-free. As described herein, void-less dielectric 142 may have an aspect ratio between 1.0 and 2.0. Where metal layer 156 (FIGS. 1-3) includes aluminum, dielectric 142 is between first aluminum structure 110 and second aluminum structure 112. Dielectric 142 presents void-less dielectric between first aluminum structure 120 and second aluminum structure 122. Dielectric 142 is void-free because first and second sidewall spacers 124, 126 have tapered sidewalls despite first and second upper metal features 120, 122 having vertical sidewalls, which aids void-free gap filling to form dielectric 142. For example, tapered sidewall spacers 124, 126 prevent premature pinch-off of the space during filling. In addition, first and second lower metal features 130, 132 have slanted sidewalls and an uppermost spacing between first and second sidewall spacers 124, 126 is greater than an uppermost spacing between first and second lower metal features 130, 132. Both of these structural arrangements aid in providing void-free gap filling to form dielectric 142, e.g., by preventing premature pinch-off of the space during filling.

First and second upper metal (e.g., aluminum) features 120, 122 have upper surface 172 having a smaller cross-sectional area than an upper surface of the respective first and second lower metal features 130, 132—see ledge 186 that provides a larger cross-sectional area on the upper surface of lower metal features 130, 132. Despite the presence of sidewall spacers 124, 126, upper metal features 120, 122 retain sufficient cross-sectional area to allow, for example, interconnect formation thereto and wafer bonding (see FIG. 7). More particularly, in contrast to conventional single etch processes that can narrow the upper surface of the metal structures, a desired critical dimension of upper metal features 120, 122 can be precisely controlled by controlling the first masked etching process in FIGS. 1-2. The blanket etch of FIG. 3 does not cause meaningful loss of cross-sectional area.

The teachings of the disclosure can be applied to any BEOL interconnect layer of an IC structure. That is, first and second metal (aluminum) structures 110, 112 may be located in a BEOL interconnect layer of an IC structure.

Embodiments of the disclosure provide various technical and commercial advantages, examples of which are discussed herein. The structure provides a void-less dielectric in a high aspect ratio opening in BEOL interconnect layers using, e.g., aluminum. The metal structures can be used for any application, e.g., metal wires or pads for hybrid bonding. The metal structures and methods described herein are design rule compliant, compatible with current semiconductor fabrication techniques, and cost-efficient to implement. In addition, the teachings of the disclosure retain sufficient cross-sectional area on upper metal features to allow electrical interconnections thereto (e.g., hybrid bonding) where conventional approaches (e.g., single etching with HDP CVD or TEOS) no longer provide sufficient cross-sectional area. The sidewall spacers provide the added advantage of protecting the metal structures from pinch-through by bond metals, e.g., copper, used for bonding pads, e.g., by contacts 194 in FIG. 7.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a first metal structure including a first upper metal feature having a first sidewall spacer and a first lower metal feature under the first upper metal feature, the first lower metal feature including a sidewall devoid of the first sidewall spacer;
   a second metal structure spaced from the first metal structure, the second metal structure including a second upper metal feature having a second sidewall spacer and a second lower metal feature under the second upper metal feature, the second lower metal feature including a sidewall devoid of the second sidewall spacer; and
   a dielectric horizontally surrounding the first metal structure and the second metal structure,
   wherein the first and second upper metal features have an upper surface having a smaller cross-sectional area than an upper surface of the respective first and second lower metal features, and the upper surface of the first and second lower metal features each include a horizontal ledge extending from sidewalls of the first and second upper metal features on which the first and second sidewall spacers rest, respectively.

2. The structure of claim 1, wherein the first and second upper metal features and the first and second lower metal features of both the first metal structure and the second metal structure include aluminum.

3. The structure of claim 1, wherein the first and second sidewall spacers include a nitride.

4. The structure of claim 1, wherein the dielectric includes an oxide.

5. The structure of claim 4, wherein the oxide includes a tetraethyl orthosilicate Si $(OC_2H_5)_4$ (TEOS) based silicon dioxide $(SiO_2)$.

6. The structure of claim 1, wherein a height of the first metal structure and a height of the second metal structure are both greater than 1000 nanometers (nm), and a minimum spacing between the first metal structure and the second metal structure is in a range of 500 nm to 1000 nm.

7. The structure of claim 1, wherein the first and second metal structures are located in a back-end-of-line interconnect layer of an integrated circuit (IC) structure.

8. The structure of claim 1, wherein the first and second sidewall spacers have tapered sidewalls, the first and second upper metal features have vertical sidewalls and the first and second lower metal features have slanted sidewalls, and
wherein an uppermost spacing between the first and second sidewall spacers is greater than an uppermost spacing between the first and second lower metal features.

9. A structure, comprising:
a first aluminum structure including a first upper aluminum feature having a first sidewall spacer and a first lower aluminum feature under the first upper aluminum feature, the first lower aluminum feature including a sidewall devoid of the first sidewall spacer;
a second aluminum structure spaced from the first aluminum structure, the second aluminum structure including a second upper aluminum feature having a second sidewall spacer and a second lower aluminum feature under the second upper aluminum feature, the second lower aluminum feature including a sidewall devoid of the second sidewall spacer; and
a void-less dielectric between the first aluminum structure and the second aluminum structure, the void-less dielectric having an aspect ratio between 1.0 and 2.0,
wherein the first and second upper aluminum features have an upper surface having a smaller cross-sectional area than an upper surface of the respective first and second lower aluminum features, and the upper surface of the first and second lower aluminum features each include a horizontal ledge extending from sidewalls of the first and second upper aluminum features on which the first and second sidewall spacers rest, respectively.

10. The structure of claim 9, wherein the first and second sidewall spacers include a nitride, and the dielectric includes a tetraethyl orthosilicate $Si(OC_2H_5)_4$ (TEOS) based silicon dioxide ($SiO_2$).

11. The structure of claim 9, wherein a height of the first aluminum structure and a height of the second aluminum structure are both greater than 1000 nanometers (nm), and a minimum spacing between the first aluminum structure and the second aluminum structure is in a range of 500 nm to 1000 nm.

12. The structure of claim 9, wherein the first and second aluminum structures are located in a back-end-of-line interconnect layer of an integrated circuit (IC) structure.

13. The structure of claim 9, wherein the first and second sidewall spacers have tapered sidewalls, the first and second upper aluminum features have vertical sidewalls and the first and second lower aluminum features have slanted sidewalls, and
wherein an uppermost spacing between the first and second sidewall spacers is greater than an uppermost spacing between the first and second lower aluminum features.

14. A method, comprising:
forming a first upper metal feature spaced from a second upper metal feature, each of the first and second upper metal features having a sidewall spacer thereabout;
forming a first lower metal feature under the first upper metal feature and a second lower metal feature under the second upper metal feature, the first and second lower metal features including sidewalls devoid of any sidewall spacer; and
filling an opening between the first upper metal feature over the first lower metal feature and the second upper metal feature over the second lower metal feature with a dielectric, devoid of voids therein,
wherein the first and second upper metal features have an upper surface having a smaller cross-sectional area than an upper surface of the respective first and second lower metal features, and the upper surface of the first and second lower metal features each include a horizontal ledge extending from sidewalls of the first and second upper metal features on which the first and second sidewall spacers rest, respectively.

15. The method of claim 14, wherein the forming the first upper metal feature spaced from the second upper metal feature is performed by removing part of a metal layer over a back-end-of-line dielectric layer; and
wherein forming the sidewall spacer, the first and second lower metal features under the first and second upper metal features, and the opening includes:
depositing a sidewall spacer material layer over the first upper metal feature, the second upper metal feature and the metal layer; and
performing a blanket etch to:
remove the sidewall spacer material layer, forming respective sidewall spacers on the first upper metal feature and the second upper metal feature, and
remove a remaining part of the metal layer to the dielectric, forming the first lower metal feature under the first upper metal feature and the second lower metal feature under the second upper metal feature, and
form the opening.

16. The method of claim 14, further comprising forming an electrical connection to each of the first upper metal feature and the second upper metal feature.

17. The method of claim 14, wherein the respective sidewall spacers have tapered sidewalls, the first and second upper metal features have vertical sidewalls and the first and second lower metal features have slanted sidewalls, and
wherein an uppermost spacing between the respective sidewall spacers is greater than an uppermost spacing between the first and second lower metal features.

18. The method of claim 14, wherein a collective height of the first upper and lower metal features and a collective height of the second upper and lower metal features are both greater than 1000 nanometers (nm), and a minimum spacing between the first lower metal feature and the second lower metal feature is in a range of 500 nm to 1000 nm.

* * * * *